US007970147B2

(12) United States Patent
Mao

(10) Patent No.: US 7,970,147 B2
(45) Date of Patent: Jun. 28, 2011

(54) VIDEO GAME CONTROLLER WITH NOISE CANCELING LOGIC

(75) Inventor: Xiadong Mao, Foster City, CA (US)

(73) Assignee: Sony Computer Entertainment Inc., Tokyo (JP)

( * ) Notice: Subject to any disclaimer, the term of this patent is extended or adjusted under 35 U.S.C. 154(b) by 1490 days.

(21) Appl. No.: 10/820,469

(22) Filed: Apr. 7, 2004

(65) Prior Publication Data

US 2005/0226431 A1 Oct. 13, 2005

(51) Int. Cl.

*H03G 3/00* (2006.01)
*H04R 3/00* (2006.01)
*G06F 17/00* (2006.01)
*G09G 5/00* (2006.01)
*A63F 13/02* (2006.01)

(52) U.S. Cl. ................ 381/61; 381/62; 381/63; 381/92; 381/111; 381/122; 463/35; 345/156; 345/157; 273/148 B

(58) Field of Classification Search .................... 463/35, 463/37; 381/92, 71.11, 17, 61–63, 111, 122; 700/94; 345/156–157, 161, 163; 273/148 B, 273/148 R
See application file for complete search history.

(56) References Cited

U.S. PATENT DOCUMENTS

| | | | | |
|---|---|---|---|---|
| 5,335,011 | A | 8/1994 | Addeo et al. | |
| 6,173,059 | B1 | 1/2001 | Huang et al. | |
| 6,339,758 | B1 | 1/2002 | Kanazawa et al. | |
| 2003/0160862 | A1 | 8/2003 | Charlier et al. | |
| 2004/0047464 | A1 | 3/2004 | Yu et al. | |
| 2004/0213419 | A1 * | 10/2004 | Varma et al. | 381/92 |
| 2005/0047611 | A1 | 3/2005 | Mao | |

FOREIGN PATENT DOCUMENTS

| | | | |
|---|---|---|---|
| EP | 0 652 686 | A1 | 5/1995 |
| EP | 652686 | A1 * | 5/1995 |
| EP | 1253581 | | 10/2002 |
| EP | 1 489 586 | A1 | 12/2004 |

OTHER PUBLICATIONS

Wilson and Darrell, "*Audio-Video Array Source Localization for Intelligent Environments*", 2002, IEEE Dept. of Electrical Eng and Computer Science, Massachusetts Inst. of Technology, Cambridge, MA 02139.

Fiala et al., "*A Panoramic Video and Acoustic Beamforming Sensor for Videoconferencing*", 2004 IEEE, Computational Video Group, National Research Council, Ottawa, CA K1A 0R6.

(Continued)

*Primary Examiner* — Devona E Faulk

(74) *Attorney, Agent, or Firm* — Martine Penilla & Gencarella, LLP

(57) ABSTRACT

A method for reducing noise disturbance associated with an audio signal received through a microphone is provided. The method initiates with magnifying a noise disturbance of the audio signal relative to a remaining component of the audio signal. Then, a sampling rate of the audio signal is decreased. Next, an even order derivative is applied to the audio signal having the decreased sampling rate to define a detection signal. Then, the noise disturbance of the audio signal is adjusted according to a statistical average of the detection signal. A system capable of canceling disturbances associated with an audio signal, a video game controller, and an integrated circuit for reducing noise disturbances associated with an audio signal are included.

7 Claims, 12 Drawing Sheets

OTHER PUBLICATIONS

Osamu Hoshuyama and Akihiko Sugiyama, “A Robust Generalized Sidelobe Canceller with a Blocking Matrix Using Leaky Adaptive Filters”, Electronics and Communications in Japan, Part 3, vol. 80, 1997 pp. 56-65.
Lucas Parra and Christopher Alvino,“ Geometric Source Separation: Merging Convolutive Source Separation With Geometric Beamforming”, Sarnoff Corporation.
Shoko Araki, Shoji Making, Ryo Mukai and Hiroshi Saruwatari, “Equivalence Between Frequency Domain Blind Source Separation and Frequency Domain Adaptive Null Beamformers”, NTT Communication Science Laboratories.
S.V. Vaseghi, B.P. Milner, “Speech Recognition in Impulsive Noise”, *School of Information Systems*, University of East Anglia, Norwich, UK, 1995, pp. 437-440.
William M. Kushner, Vladimir Goncharoff, Chung Wu, Vien Nguyen and John N. Damoulakis, “The Effects of Subtractive-Type Speech Enhancement/Noise Reduction Algorithms On Parameter Estimation For Improved Recognition and Coding In High Noise Environments”, *Martin Marietta Aero & Naval Systems*, 1989, pp. 211-214.

* cited by examiner

VIDEO GAME CONTROLLER WITH NOISE CANCELING LOGIC

CROSS REFERENCE TO RELATED APPLICATION

This application is related to U.S. patent application Ser. No. 10/650/409, filed on Aug. 27, 2003 and entitled "Audio Input System," which is incorporated herein by reference in its entirety for all purposes.

BACKGROUND OF THE INVENTION

1. Field of the Invention

This invention relates generally to audio processing and more particularly to a system capable of identifying and removing noise disturbances from an audio signal.

2. Description of the Related Art

Voice input systems are typically designed as a microphone worn near the mouth of the speaker where the microphone is tethered to a headset. Since this imposes a physical restraint on the user, i.e., having to wear the headset, users will typically use the headset for only a substantial dictation and rely on keyboard typing for relatively brief input and computer commands in order to avoid wearing the headset.

Video game consoles have become a commonplace item in the home. The video game manufacturers are constantly striving to provide a more realistic experience for the user and to expand the limitations of gaming, e.g., on line applications. For example, the ability to communicate with additional players in a room having a number of noises being generated, or even for users to send and receive audio signals when playing on-line games against each other where background noises and noise from the game itself interferes with this communication, has so far prevented the ability for clear and effective player to player communication in real time. These same obstacles have prevented the ability of the player to provide voice commands that are delivered to the video game console. Here again, the background noise, game noise and room reverberations all interfere with the audio signal from the player.

As users are not so inclined to wear a headset, one alternative to the headset is the use of a microphone to capture the sound. However, shortcomings with the microphone systems currently on the market today is the inability to detect and remove noise disturbances from the audio signal. It should be appreciated that where the microphone is incorporated into an input device, e.g., a video game controller, noise disturbances arise from various kinds of mechanical activities on the input device. For example, with a game controller the noise disturbance can result from button pushes, joystick clicks, finger taps, table hits, controller vibration, surface friction, etc.

Due to the unique nature of close distances between a microphone sensor and various type mechanical input devices mounted on an input device, such as a game controller, the sharp disturbances occur when the microphone picks up and amplifies nearside mechanical noises, e.g. pushing game button, clicking joystick, hitting table, tapping controller surface, force feedback, vibration, etc. Unlike the classical problem of removing impulsive noises resulted from analog signal transmission, here the mechanical disturbance has a much longer and more dynamic shelf life. The disturbance's audible duration may range from a sharp steep impulse less than 50 ms (such as joystick click) all the way up to the whole lifetime of an utterance (such as talking while touching the surface of haptic device). Besides, some percussive human sounds, such as yelling, stop-consonants, etc., further blur the line drawn between the wanted "normal sound" (also referred to as target sound) and mechanical disturbance (also referred to as noise disturbance). Furthermore, the restoration of the corrupted audio signal must attain an efficient separation of mechanical noise from the audio signal.

As a result, there is a need to solve the problems of the prior art to provide a microphone used in conjunction with an input device in order to detect and remove the noise disturbances generated in the near field.

SUMMARY OF THE INVENTION

Broadly speaking, the present invention fills these needs by providing a method and apparatus that defines a scheme for detecting and removing mechanical disturbances from vocal track signals. It should be appreciated that the present invention can be implemented in numerous ways, including as a method, a system, computer readable medium or a device. Several inventive embodiments of the present invention are described below.

In one embodiment, a method for processing an audio signal is provided. The method initiates with receiving a signal composed of a harmonic portion and a disturbance portion. Then, an amplitude associated with the harmonic portion of the audio signal is reduced. Next, a sampling rate of the audio signal having the reduced amplitude of the harmonic portion is decreased. Then, a type of signal sequence associated with the disturbance portion of the audio signal is identified. Next, the disturbance portion is modified according to the type of the signal sequence.

In another embodiment, a method for reducing a noise disturbance associated with an audio signal received through a microphone is provided. The method initiates with magnifying a noise disturbance of the audio signal relative to a remaining component of the audio signal. Then, a sampling rate of the audio signal is decreased. Next, an even order derivative is applied to the audio signal having the decreased sampling rate to define a detection signal. Then, the noise disturbance of the audio signal is adjusted according to a statistical average of the detection signal.

In yet another embodiment, a computer readable medium having program instructions for processing an audio signal is provided. The computer readable medium includes program instructions for receiving a signal composed of a harmonic portion and a disturbance portion. Program instructions for reducing an amplitude associated with the harmonic portion of the audio signal and program instructions for decreasing a sampling rate of the audio signal having the reduced amplitude of the harmonic portion are provided. Program instructions for identifying a type of signal sequence associated with the disturbance portion of the audio signal and program instructions for modifying the disturbance portion according to the type of the signal sequence are included.

In still yet another embodiment, a computer readable medium having program instructions for reducing a noise disturbance associated with an audio signal received through a microphone is provided. The computer readable medium includes program instructions for magnifying a noise disturbance of the audio signal relative to a remaining component of the audio signal. Program instructions for decreasing a sampling rate of the audio signal are included. Program instructions for applying an even order derivative to the audio signal having the decreased sampling rate to define a detection signal and program instructions for adjusting the noise disturbance of the audio signal according to a statistical average of the detection signal are included.

In another embodiment, a system capable of canceling disturbances associated with an audio signal is provided. The system includes a computing device having logic for processing an audio signal. The logic for processing the audio signal includes logic for generating a detection signal from the audio signal and logic for determining whether a signal sequence of the audio signal is a disturbance through analysis of a corresponding signal sequence of the detection signal. The system also includes an input device operatively connected to the computing device and a microphone configured to capture the audio signal. The microphone is positioned so that a source of the disturbance is located within a near-field associated with the microphone and a source of a target component of the audio signal is located within a far field associated with the microphone.

In yet another embodiment, a video game controller is provided. The video game controller includes a microphone affixed to the video game controller. The microphone is configured to detect an audio signal that includes a target audio signal in a far field relative to the microphone and disturbance noise in a near field relative to the microphone. The video game controller includes logic configured to process the audio signal. The logic includes detection signal logic configured to generate a detection signal through application of an even ordered derivative to the audio signal and disturbance cancellation logic configured to remove disturbance noise from the audio signal through analysis of the detection signal.

In still yet another embodiment, an integrated circuit is provided. The integrated circuit includes circuitry configured to receive an audio signal from at least one microphone in a multiple noise source environment. Circuitry configured to perform signal decorrelation on the audio signal and circuitry configured to downsample the decorrelated audio signal are provided. Circuitry configured to apply a differentiation operation to the downsampled audio signal is included. Circuitry configured to detect a noise disturbance signal sequence within the differentiated audio signal and circuitry configured to remove a signal sequence of the audio signal associated with the noise disturbance signal sequence are provided.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

Figure 1A:
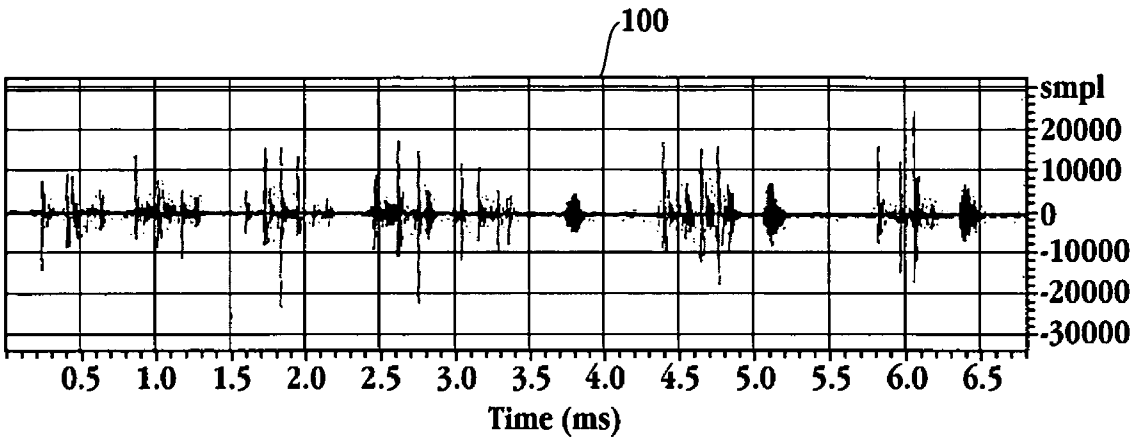
FIGS. 1A and 1B are exemplary graphs representing an audio signal footprint before and after noise disturbance removal, respectively, in accordance with one embodiment of the invention.

An invention is described for a system, apparatus and method for an audio input system configured to detect and cancel noise disturbances generated in a near field, relative to an input device of the system. It will be obvious, however, to one skilled in the art, that the present invention may be practiced without some or all of these specific details. In other instances, well known process operations have not been described in detail in order not to unnecessarily obscure the present invention.

The embodiments of the present invention provide a system and method for an audio input system associated with a consumer device. The input system is capable of detecting noise disturbances and efficiently removing the noise disturbances from the audio signal in order to provide a "cleaner" signal. Where the embodiments described herein are incorporated into an input device, the noise disturbance emanates from a near field, while the target signal is generated from a far field. It should be appreciated that the target signal may be a user's speech, music, a vocal track signal or any other sound that is desired to be recorded. Thus, for a video game environment, it may be desirable to capture the user's voice for input control of the game, online gaming applications, etc. It should be appreciated that the noise disturbance may be a mechanical noise from a user operating an input device. In essence, the noise disturbance may be any signal having a pulse. The noise disturbance may also be an utterance from the user. As described below, the signal detection and separation of the noise disturbance is divided in three stages: (1) spectral whitening, (2) disturbance detection, and (3) signal correction.

The spectral whitening stage has the effect of flattening the spectrum of the target signal portion of the audio signal. Thus, the noise disturbance portion is magnified relative to the target signal portion after the application of spectral whitening. The disturbance detection stage takes the output of the spectral whitening stage and further differentiates the target signal from the noise disturbance, as well as generating a detection signal. Here, through the application of an even order derivative to the downsampled output of the spectral whitening stage this objective is achieved. In the signal correction stage, the detection signal is analyzed to determine whether a signal sequence includes purely noise disturbance, purely target signal, or some combination of both. Based on the signal type associated with the detection signal, the audio signal is corrected in order to substantially eliminate noise disturbances if they exist. One skilled in the art will appreciate that while the embodiments described herein are discussed in reference to a video game controller, the embodiments may be extended to any suitable input device where an audio signal is being captured and noise disturbances may be incorporated with a target signal.

A computationally efficient method and system for detecting and canceling the sharp mechanical disturbances presented in digital speech recorded by microphone mounted on game controller is discussed in more detail below. Sources of noise disturbance arise from various kinds of mechanical activities on an input device, e.g., a game controller. These mechanical activities include a button push, joystick click, finger tap, table hit, controller vibration, haptic feedback, surface friction, etc. The aim of the detection scheme is to find and verify mechanical disturbances without a false positive in the presence of a percussive voice, strong music or stop-consonants in speech. The separation and removal of such disturbances from the audio signal is performed in a manner to limit the loss of recording quality. In most circumstances, the proposed method effectively reduces the level of sharp noises with little or an unperceivable amount of acoustic distortion.

Figure 1B:
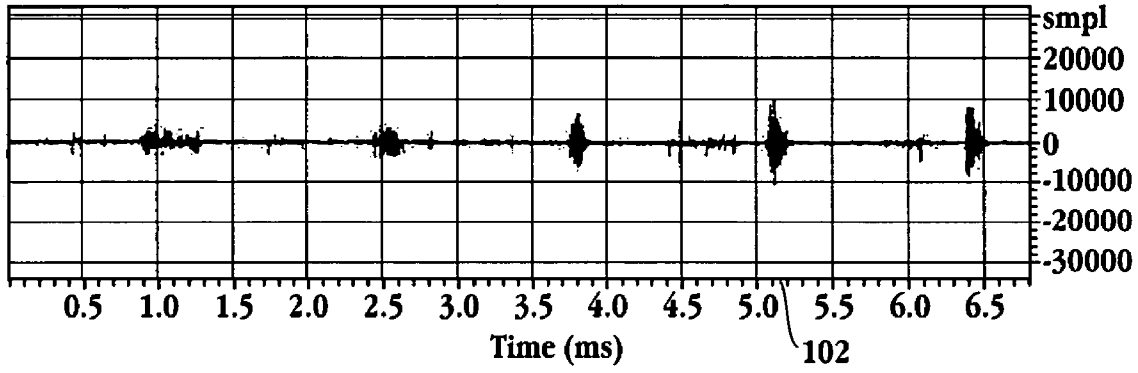

FIGS. 1A and 1B are exemplary graphs representing an audio signal footprint before and after noise disturbance removal, respectively, in accordance with one embodiment of the invention. Chart 100 illustrates the audio signal footprint prior to disturbance removal, while chart 102 illustrates the audio footprint after disturbance removal. After application of the embodiments described herein, the mechanical audio disturbances depicted by the sharp abrupt peaks in chart 100 are removed so that the audio footprint of chart 102 includes substantially all of the vocal audio signals, which may be the target audio signals being captured. It should be appreciated that the sharp disturbances occur when a microphone picks up and amplifies near-side mechanical noises e.g. pushing game button, clicking joystick, hitting table, tapping controller surface, force feedback, vibration, etc. The mechanical disturbance may have a dynamic shelf life.

Figure 2:
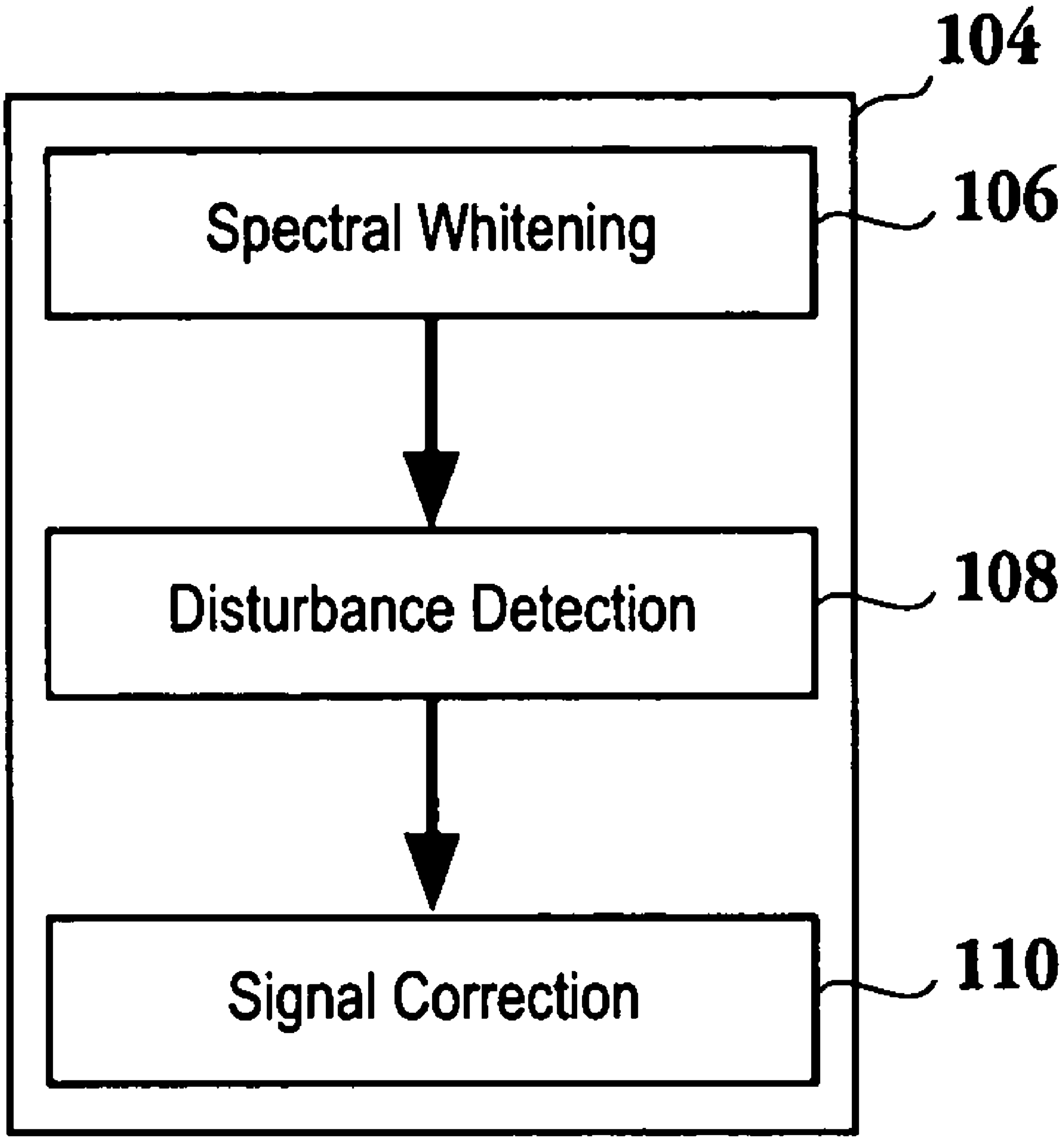
FIG. 2 is a simplified schematic diagram illustrating the modules associated with the removal of noise disturbances in accordance with one embodiment of the invention.

FIG. 2 is a simplified schematic diagram illustrating the modules associated with the removal of noise disturbances in accordance with one embodiment of the invention. Module 104 includes spectral whitening block 106, disturbance detection block 108 and signal correction block 110. Each of these blocks performs specific functional aspects described below in order to remove mechanical audio disturbances from a microphone sensing an audio signal. It should be appreciated that the target component of the audio signal is in a far field, while the noise disturbances of the audio signal are in the near field. It should be further appreciated that module 104 may be included within a computing device, or an input device in communication with a computing device. Alternatively, module 104 may be configured as a plug-in card, or an integrated circuit on a printed circuit board which is incorporated into a computing device or input device. One skilled in the art will appreciate that the embodiments described herein may be applied to a video game console and corresponding game controller as described in more detail below. However, the embodiments described herein may be extended to any suitable input device associated with noise disturbances that are desired to be removed from a captured audio signal.

Figure 3A:
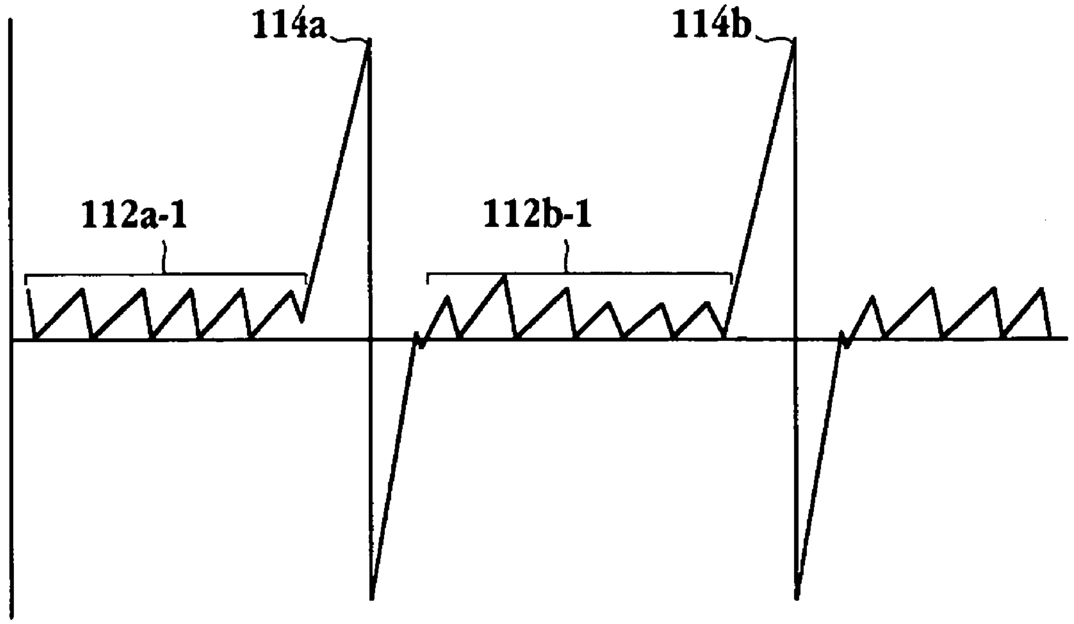
FIGS. 3A and 3B are exemplary graphs illustrating the effect of the spectral whitening functionality in accordance with one embodiment of the invention.
Figure 3B:
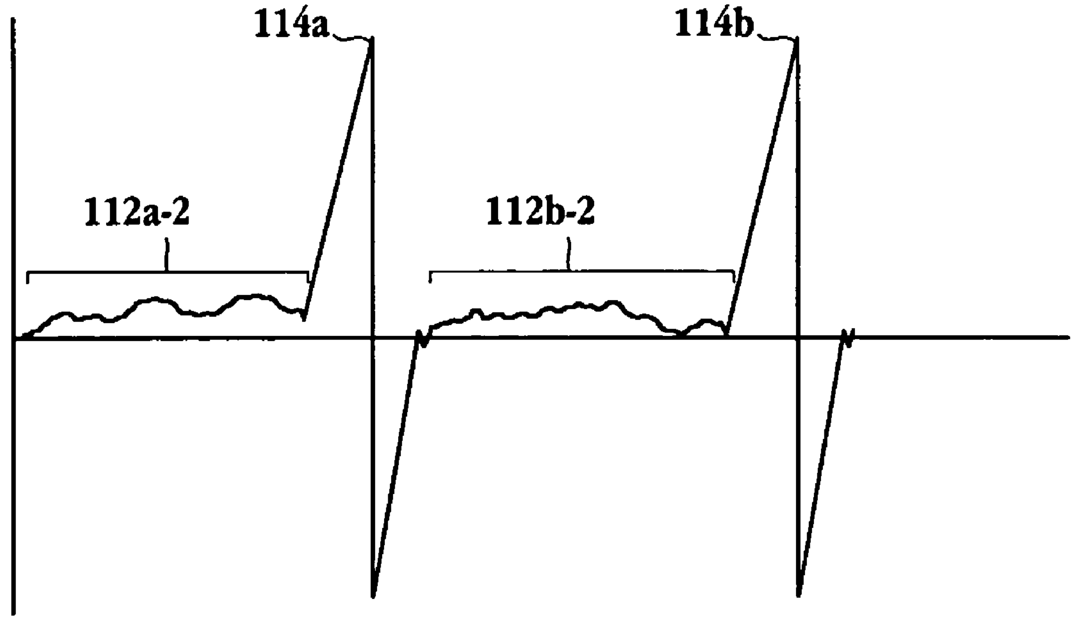

FIGS. 3A and 3B are exemplary graphs illustrating the effect of the spectral whitening functionality in accordance with one embodiment of the invention. FIG. 3A illustrates an original audio signal captured through a microphone located on a game controller in one embodiment. FIG. 3B is the resulting audio signal from FIG. 3A once the spectral whitening technique has been applied to the audio signal of FIG. 3A. Here, an inverse impulse response (IIR) filter, also referred to as a linear prediction error filter, is used to filter the signal represented in FIG. 3A in order to obtain the signal of FIG. 3B. As can be seen by comparing FIGS. 3A and 3B, the amplitude associated with a resonance of a target signal, illustrated in regions 112*a*-1 and 112*b*-1 of FIG. 3A, are flattened as illustrated in corresponding regions 112*a*-2 and 112*b*-2 of FIG. 3B, respectively.

However, peaks 114*a* and 114*b*, which represent a mechanical audio disturbance or some other noise disturbance, are left unaffected by the spectral whitening operation. In essence, the noise disturbance of the audio signal is magnified relative to the target component of the audio signal. That is, the inverse filer of all-pole IIR is used to simulate the vocal track model to perform signal decorrelation, which has the effect of flattening the spectrum of the input signal. The vocal sound or music which is being recorded, i.e., target sound, is highly correlated, and composed of random excitations spectrally shaped and amplified by the resonances of vocal tract of the musical instruments. After signal decorrelation, the scale of the voice/music signal amplitude is reduced to almost that of the original excitation signal. The original excitation signal often has a much smaller amplitude range, whereas the scale of the mechanical noise amplitude remains largely untouched or increases. Thus, the noise detectability is substantially improved by the magnification of the difference between the target noise and the noise disturbance.

Disturbance detection further magnifies this relationship by taking the spectral whitened signal represented in FIG. 3B and downsampling the signal by a factor of 10, in accordance with one embodiment of the invention. Here, a math model is applied to the spectral whitened signal in order to generate a detection signal. It should be appreciated that the audio signal is highly correlated, i.e., a current signal is based upon past signals. In order to decorrelate the audio signal, a differentiation operation is performed on the downsampled detection signal. In one embodiment, a fourth order derivative is used to differentiate the audio signal for the decorrelation operation. It should be further appreciated that any suitable derivative may be used for this operation, e.g., any even number ordered derivative less than or equal to a tenth derivative.

Figure 4:
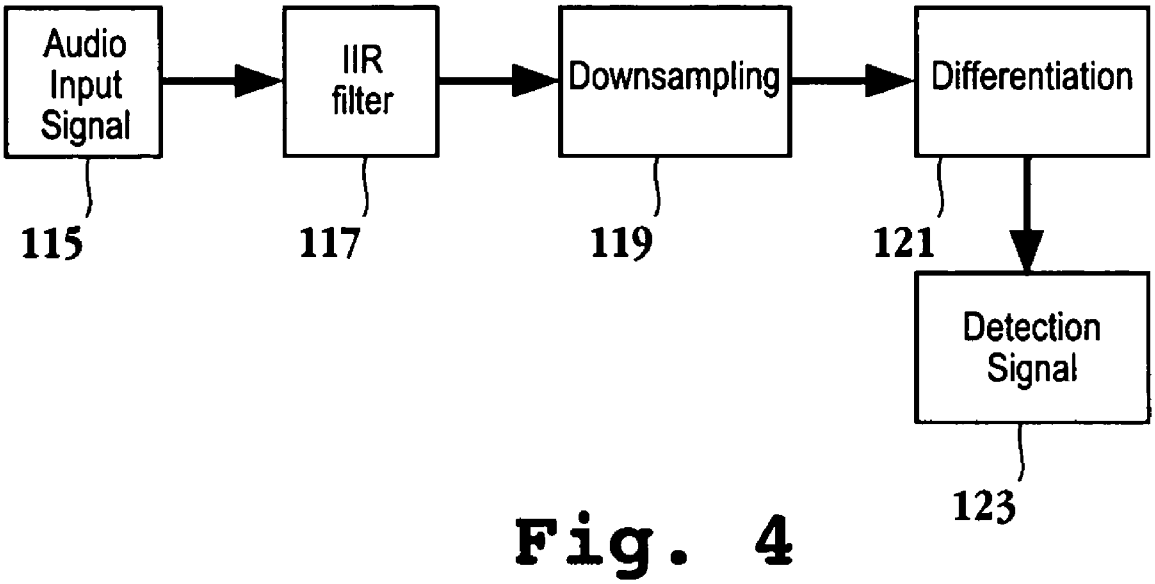
FIG. 4 is a simplified schematic of the components of the disturbance detection module in accordance with one embodiment of the invention.

FIG. 4 is a simplified schematic of the components of the disturbance detection module in accordance with one embodiment of the invention. Audio input signal 115, which includes the target signal and the noise disturbance, is received by IIR filter 117. As mentioned above, IIR filter 117 magnifies the difference between the noise disturbance and the target signal by flattening the target signal amplitude. The output signal of IIR filter 117 is downsampled through downsampling module 119. One skilled in the art will appreciate that a low pass filter having a cut-off of 800 Hz may be used here. It should be appreciated that the mechanical noise associated with input devices tends to have a frequency below 800 Hz. Thus, the frequency characteristics of the mechanical noise are preserved here. For exemplary purposes a downsampling factor of 10 is discussed herein. However, one skilled in the art will appreciate that alternative downsampling schemes using a factor other than 10 may be employed as long as the frequency characteristics of the mechanical noise are preserved, while maintaining an acceptable level of perceivable detection error. The downsampling reduces the computational complexity without introducing perceivable detection error. Thus, the spectral-whitened input signal is downsampled by a factor of 10 to 1.6 KHz (assuming the audio sampling rate is 16 KHz) to form a compressed signal, thereby ensuring a sampling frequency at least twice the upper frequency limit (800 Hz) of the downsampling filter.

Continuing with FIG. 4, the compressed signal from downsampling module 119 is input to differentiation module 121. In one embodiment, a fourth order derivative is applied to the downsampled signal. It should be appreciated that the noise detectability is further enhanced by utilizing another characteristic difference between disturbance and harmonics. That is, the disturbance typically introduces uncharacteristic discontinuity (sudden fast change) in a correlated signal. This discontinuity becomes more detectable when the signal is differentiated through discrete signal differentiation to form the detection signal. In one embodiment, the discrete signal differentiation observes the difference between successive signal, i.e. the discrete derivative of the signal. In one embodiment, the fourth-order derivative provides an accurate measure to detect the smallest audible changes. While the fourth order derivative is provided for exemplary purposes, one skilled in the art will appreciate that any order derivative having an order between 2 and 10, where the order is an even number, may be applied here.

The detection strategy includes adaptive thresholding. In this methodology, the threshold above which a signal sample is determined as being a "disturbance" is adaptively adjusted by statistical averaging (adaptive thresholding) of the detection signal which is the fourth-order derivative of the input signal. It should be appreciated that the use of a downsampled compressed signal not only simplifies the computation by a magnitude, but also makes the detection signal much more discriminative, partially because the reduced signal needs a lower order derivative for detection, while a higher order derivative is much more unstable.

Signal correction functionality is then applied based upon the disturbance detection signal as described below. It should be appreciated that the disturbance detection signal may indicate that certain signal sequences of the disturbance detection signal are one of the following signal sequence types: solely noise disturbance, purely voice or target signal, or some combination of the two. When the signal sequence is solely disturbance, the signal sequence is removed and a signal sequence computed by linear interpolation of its predecessor and successor replaces the removed signal sequence. Where the signal sequence is solely normal sound (target signal), the frequency weighting factor is updated for each frequency bin to reflect the most recent characteristic of the target signal in the frequency-domain. If the signal sequence is suspected as being a noise disturbance or a mixture of the target sound and a noise/mechanical disturbance, the signal is then transformed to the frequency domain from the time domain. Each frequency bin is then scaled in terms of the adapted frequency weighting factor, the frequency scaled complex signal is transformed back to the time-domain afterwards to form the clean output signal. In one embodiment, the mechanical noise-frequency distribution is adaptively updated through continuous learning in order to maximally preserve the voice quality and restrain any signal distortion. Here, only frequency bins that are suspected of being noise components are scaled, whereas the rest of the noise-free frequency components are untouched.

Figure 5A:
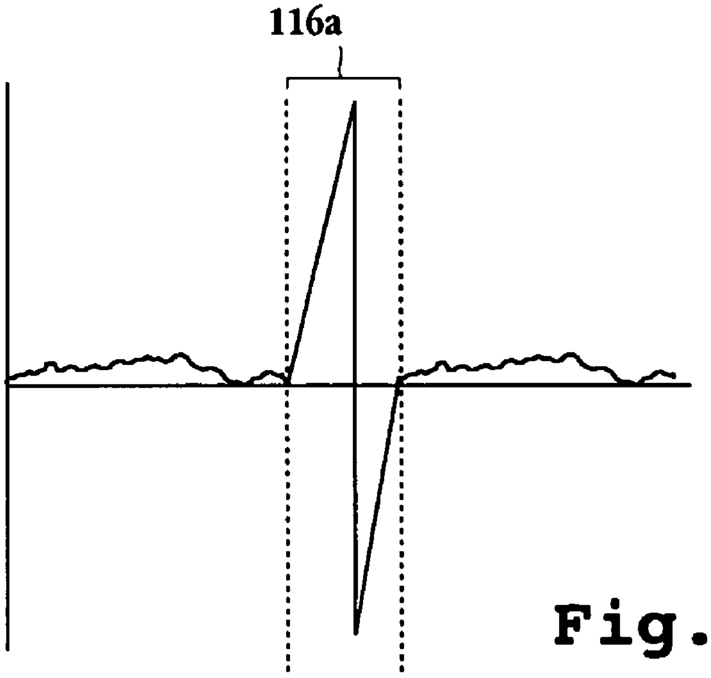
FIGS. 5A through 5C are exemplary graphs illustrating a signal correction scheme applied when the disturbance detection signal indicates that a signal sequence is purely noise disturbance in accordance with one embodiment of the invention.
Figure 5B:
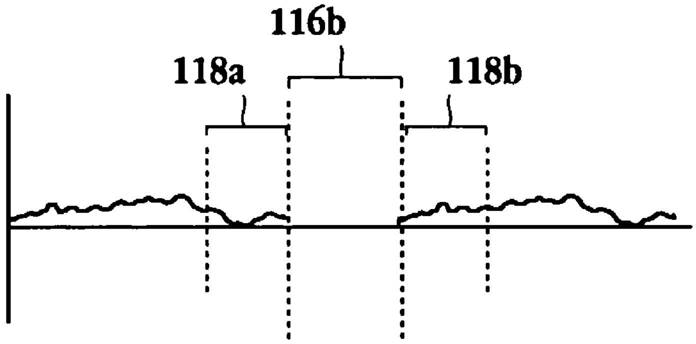
Figure 5C:
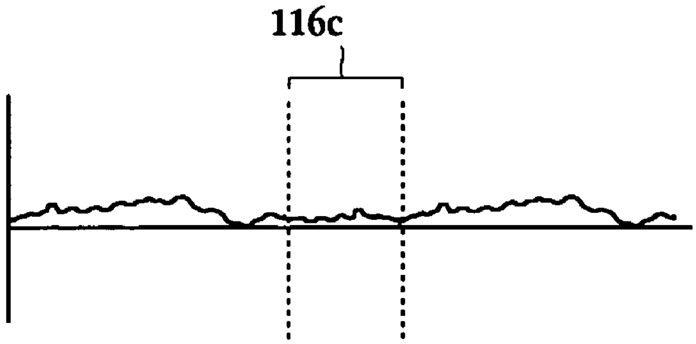

FIGS. 5A through 5C are exemplary graphs illustrating a signal correction scheme applied when the disturbance detection signal indicates that a signal sequence is purely noise disturbance in accordance with one embodiment of the invention. In FIG. 5A, region 116*a* is a signal sequence which is purely a noise disturbance. When this occurs, the signal contained within region 116*a* of FIG. 5A is removed resulting in the void illustrated by region 116*b* of FIG. 5B. Regions 118*a* and 118*b*, i.e., regions preceding the void and following the void, respectively, are used to linearly interpolate a signal to fill the void. Through the linear interpolation process a signal sequence is identified that is used to fill in the void of region 116*b*, as illustrated in region 116*c* of FIG. 5C. In one embodiment, the pure noise disturbance occurs where a user is playing a game and manipulating the game controller without any utterances. Alternatively, a user may be uttering stop consonants or percussive sounds not related to the target signal and these stop consonants may be removed from the signal as described herein.

Figure 6A:
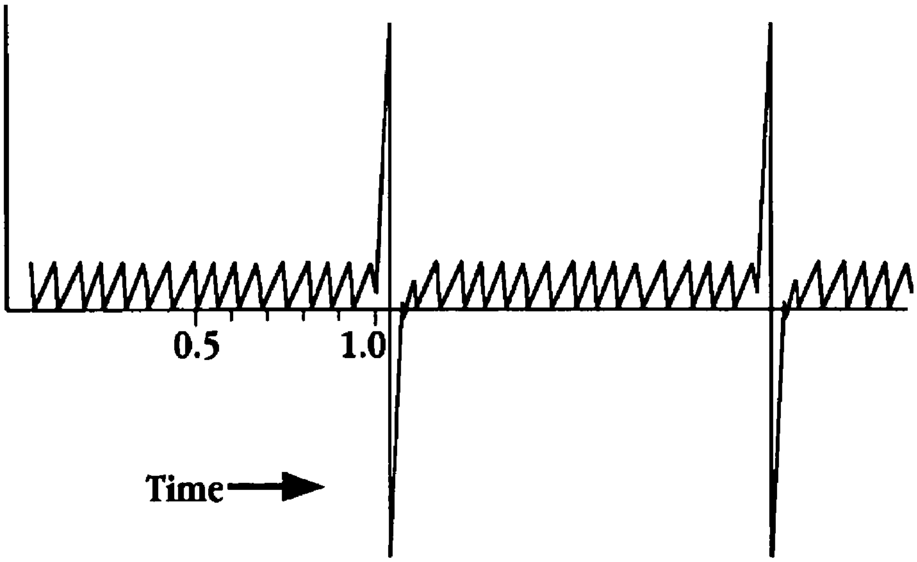
FIG. 6A is a graphical representation of a detection signal in the time domain where the audio signal is a combination of target component and noise disturbance in accordance with one embodiment of the invention.

FIG. 6A is a graphical representation of a detection signal in the time domain where the audio signal is a combination of target component and noise disturbance in accordance with one embodiment of the invention. Here, the peak at time 1.0 includes both a target component and a noise disturbance. Where this occurs, the signal correction functionality converts specific time points to a frequency domain as discussed below.

Figure 6B:
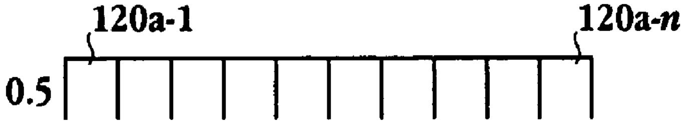
FIGS. 6B through 6D represent frequency domain illustrations corresponding to a particular time point of FIG. 6A.
Figure 6C:
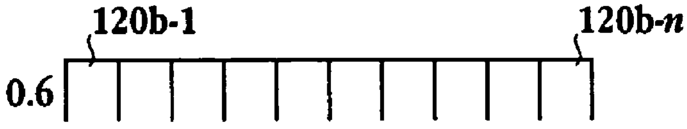
Figure 6D:
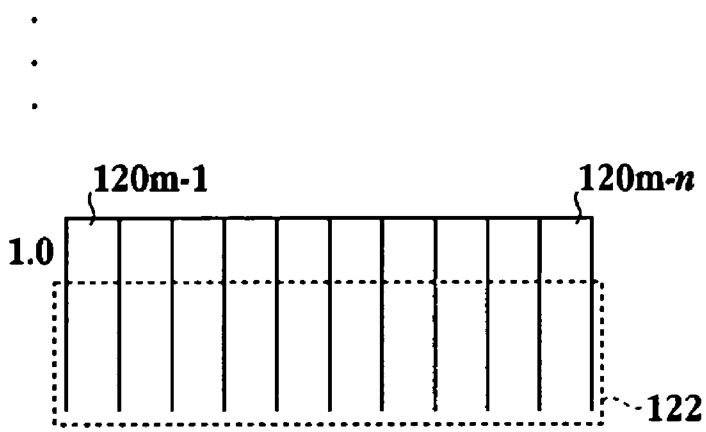

FIGS. 6B through 6D represent frequency domain illustrations corresponding to a particular time point of FIG. 6A. FIG. 6B illustrates the frequency domain corresponding to time point 0.5. FIG. 6C illustrates the frequency domain corresponding to time point 0.6. FIG. 6D illustrates the frequency domain corresponding to time point 1.0. One skilled in the art will appreciate that a short-time Fast Fourier Transform (FFT) may be used to convert the signal to the frequency domain. Mathematically this may be represented as:

$X(t) \rightarrow x(k, j)$ for $k=0{:}k$, where k represents the frequency bin, and j represents the frame index The frequency weighting factor for each frequency bin may be represented as:

$S(j)_k = \text{mean}(X_{voice}(k))$, to avoid saving the previous signals, the mean operator is replaced with $1^{st}$-order smoothing operator $$S(j)_k = S(j-1)_k * \text{alpha} + (1.0 - \text{alpha}) * X_{voice}(k,j),$$

where alpha is forgetting factor between 0 to 1

As can be seen in FIG. 6B and 6C frequency bins 120*a*-1 through 120*a*-n of FIG. 6B and 120*b*-1 through 120*b*-n of FIG. 6C illustrate a target component. However, frequency bins 120*m*-1 through 120*m*-n of FIG. 6D illustrate the frequency components which include target component and noise disturbance. In one embodiment, each frequency bin corresponds to a 20 Hz frequency range. That is frequency bin 1 corresponds to a frequency range of 0-20, frequency bin 2 corresponds to a frequency range of 21-40, . . . and so forth up to 8 KHz. Of course, the frequency bins are not limited to 20 Hz increments, as any suitable incrementing scheme may be applied. The magnitude of each of the frequency bins is adjusted by a weight factor. The weight factor essentially removes the noise disturbance component of each frequency bin.

Figure 7:
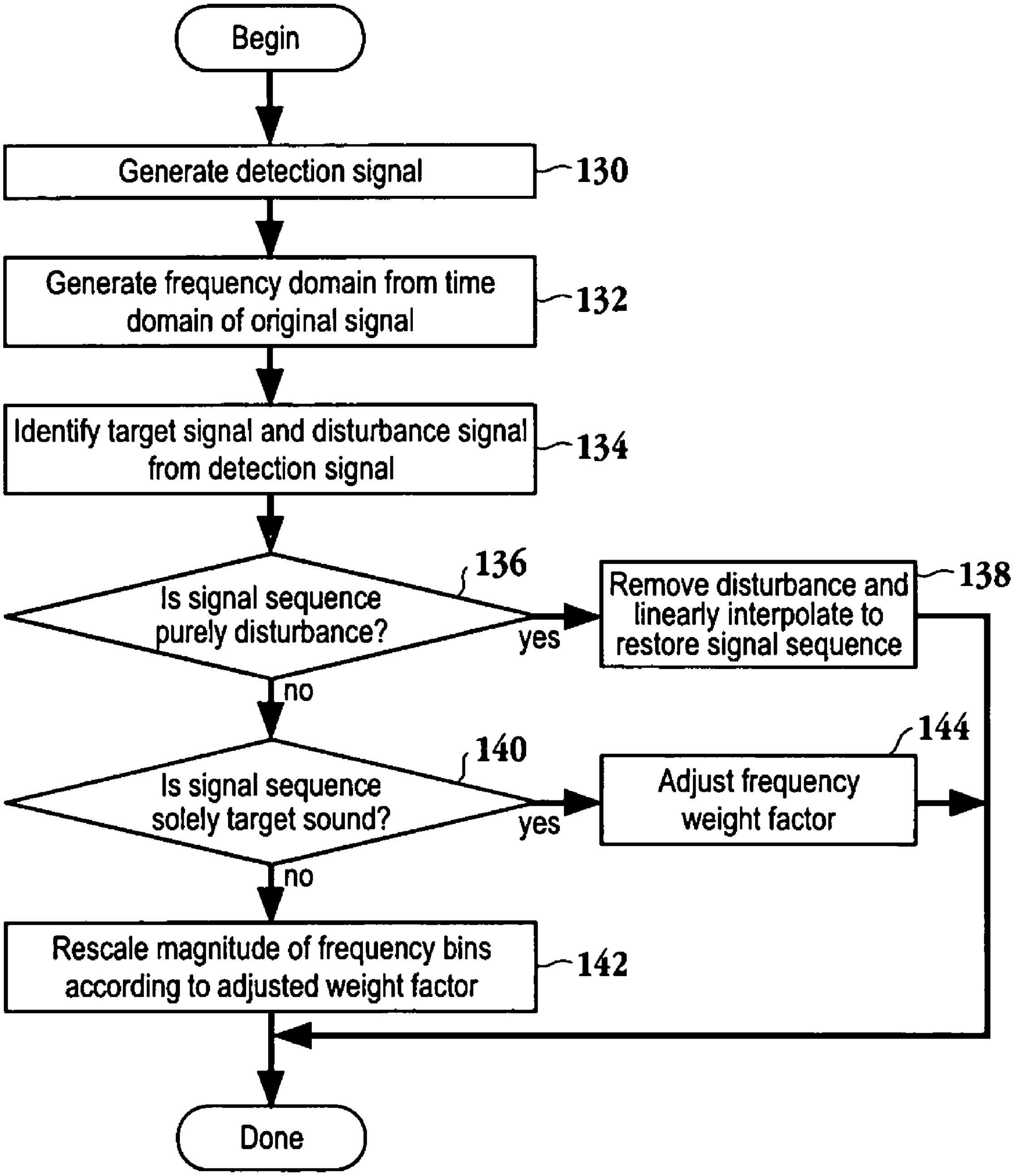
FIG. 7 is a flow chart diagram illustrating the method operations for reducing noise disturbance associated with an audio signal in accordance with one embodiment of the invention.

FIG. 7 is a flow chart diagram illustrating the method operations for reducing noise disturbance associated with an audio signal in accordance with one embodiment of the invention. The method initiates with operation 130 where a detection signal is generated. It should be appreciated that the detection signal may be generated by downsampling a spectrally whitened signal followed by a fourth order derivative applied to the downsampled signal as discussed above with reference to FIG. 4. This operation occurs as part of the detection module of FIG. 2. The method then advances to operation 132 where the original signal is converted to the frequency domain. Here a Fast Fourier Transform (FFT) is used to convert the signal from the time domain to the frequency domain. In operation 134 a target signal component and a disturbance signal component are identified from the detection signal. The detection signal is generated as described above with reference to FIG. 4. For a particular signal sequence, it is determined if the signal sequence is purely a noise disturbance in operation 136. If the signal sequence is purely disturbance then the method advances to operation 138 where the disturbance is removed and linear interpolation is applied to restore the signal sequence, as discussed above with reference to FIGS. 5A through 5C. It should be appreciated that this is achieved without the need to convert the signal sequence to the frequency domain. If the signal sequence is not purely disturbance, the method moves to operation 140 where it is determined if the signal sequence is solely target sound. If the signal sequence is not solely target sound, then the method proceeds to operation 142. In operation 142, the magnitude of frequency bins are rescaled according to an adjusted frequency weight factor. The adjusted frequency weight factor is determined by statistical mean operator, in practice, it is replaced with $1^{st}$-order smoothing operator, i.e., smoothes the previous frequency spectrum with current frequency spectrum to generate statistically averaged frequency spectrum as weight factors for each frequency bin. If the signal sequence is solely target sound as determined in operation 140, then the method advances to operation 144. In operation 144, the frequency weight factor for each frequency bin is adjusted.

Figure 8:
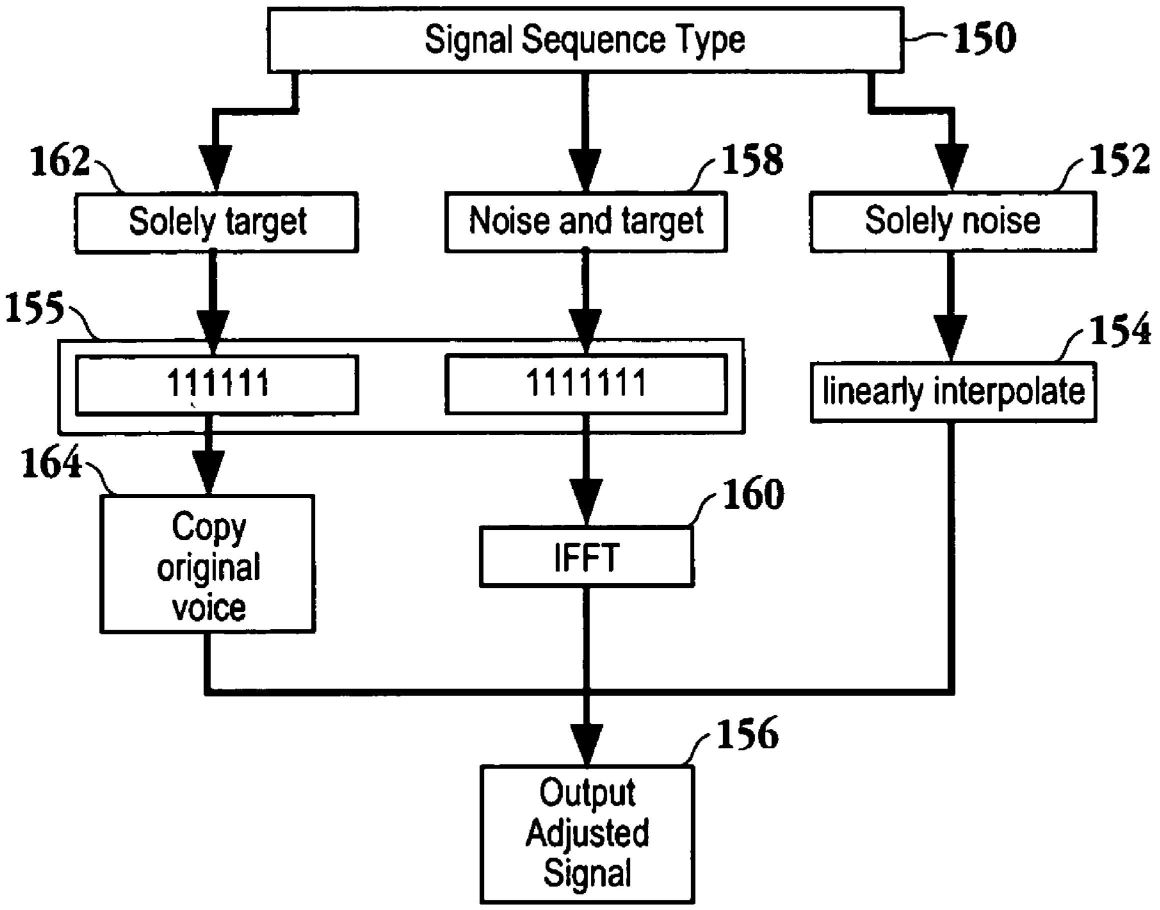
FIG. 8 is a simplified schematic diagram further illustrating the signal correction applied to the various types of signal sequences identified by the detection signal in accordance with one embodiment of the invention.

FIG. 8 is a simplified schematic diagram further illustrating the signal correction applied to the various types of signal sequences identified by the detection signal in accordance with one embodiment of the invention. Module 150 represents a particular signal sequence type. The particular sequence type may be solely a target sequence 162, a combination of noise and target sequences 158, or solely a noise sequence 152. Where the signal sequence type is solely noise 152, then linear interpolation module 154 generates a linearly interpolated output adjusted signal 156. Where the signal sequence type is solely a target signal sequence 162 then the sequence is converted from the time domain to frequency domain 155 and an adjusted weight factor is determined. In block 164, the original voice is copied in order to generate an adjusted output signal 156. It should be appreciated that the frequency weight factor for each frequency bin is adjusted here. Where the signal sequence type is a combination of a noise disturbance and target component 158, the sequence is converted to frequency domain 155. The frequency bins for the associated signal sequence is then adjusted as described above with reference to FIGS. 6A through 6D. Here, the adjusted frequency weight factor is used to adjust the respective frequency bin. The adjusted signal in the frequency domain is then converted to the time domain by applying an inverse Fast Fourier Transform (IFFT) in module 160. The resulting signal from module 160 is then used as an output adjusted signal 156.

Figure 9A:
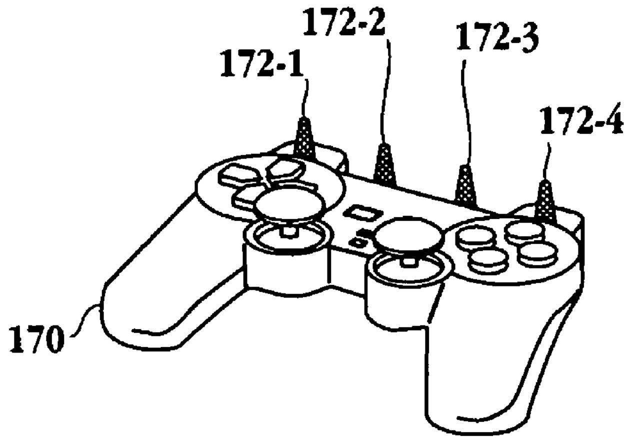
FIGS. 9A through 9C illustrate various embodiments of an input device containing single and multiple microphones in accordance with one embodiment of the invention.
Figure 9B:
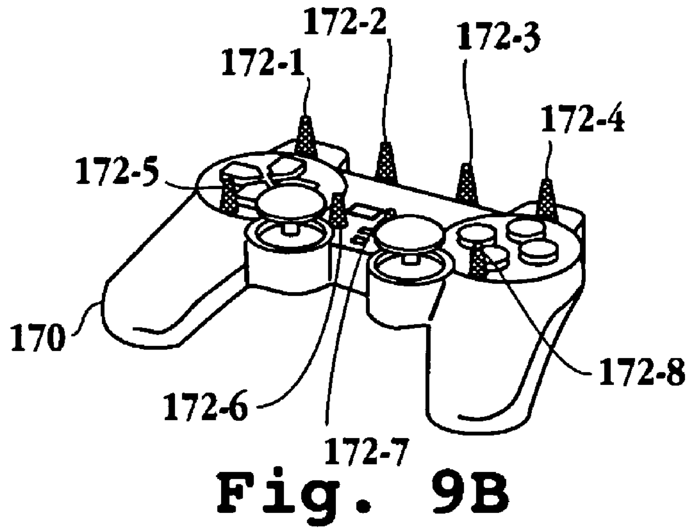
Figure 9C:
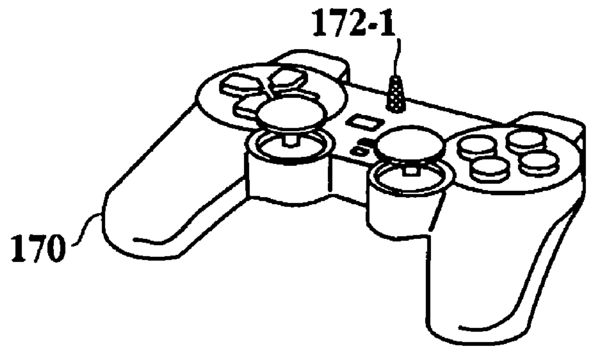

FIGS. 9A through 9C illustrate various embodiments of an input device containing single and multiple microphones in accordance with one embodiment of the invention. FIG. 9A illustrates microphone sensors 172-1, 172-2, 172-3 and 172-4 oriented in an equally spaced straight line array geometry on video game controller 170. In one embodiment, each of the microphone sensors 172-1 through 172-4 are approximately 2.5 cm apart. However, it should be appreciated that microphone sensors 172-1 through 172-4 may be placed at any suitable distance apart from each other on video game controller 170. Additionally, video game controller 170 is illustrated as a SONY PLAYSTATION 2 Video Game Controller, however, video game controller 170 may be any suitable video game controller. The embodiments described herein may be incorporated with the embodiments of U.S. application Ser. No. 10/650/409, which has been incorporated by reference, to enable tracking of a user's voice while the user is moving.

FIG. 9B illustrates an 8 sensor, equally spaced rectangle array geometry for microphone sensors 172-1 through 172-8 on video game controller 170. It will be apparent to one skilled in the art that the number of sensors used on video game controller 170 may be any suitable number of sensors. Furthermore, the audio sampling rate and the available mounting area on the game controller may place limitations on the configuration of the microphone sensor array. In one embodiment, the arrayed geometry includes four to twelve sensors forming a convex geometry, e.g., a rectangle. The convex geometry is capable of providing not only the sound source direction (two-dimension) tracking as the straight line array does, but is also capable of providing an accurate sound location detection in three-dimensional space. While the embodiments described herein refer typically to a straight line array system, it will be apparent to one skilled in the art that the embodiments described herein may be extended to any number of sensors as well as any suitable array geometry set up. Moreover, the embodiments described herein refer to a video game controller having the microphone affixed thereto. However, the embodiments described below may be extended to any suitable portable consumer device utilizing a voice input system where the microphone is not affixed to the input device.

In one embodiment, an exemplary four-sensor based microphone array may be configured to have the following characteristics:

1. An audio sampling rate that is 16 kHz;
2. A geometry that is an equally spaced straight-line array, with a spacing of one-half wave length at the highest frequency of interest, e.g., 2.0 cm. between each of the microphone sensors. The frequency range is about 120 Hz to about 8 kHz;
3. The hardware for the four-sensor based microphone array may also include a sequential analog-to-digital converter with 64 kHz sampling rate; and
4. The microphone sensor may be a general purpose omnidirectional sensor.

FIG. 9C illustrates game controller 170 having a single microphone 172-1. While microphone 172-1 is illustrated being located essentially in the center of game controller 170, it should be appreciated that microphone 172-1 may be located anywhere on the game controller. Alternatively, microphone 172-1 may be located proximate to the game controller without being affixed to the game controller, as long as the noise disturbance source is located in the near field and the target component source is located in the far field.

Figure 10A:
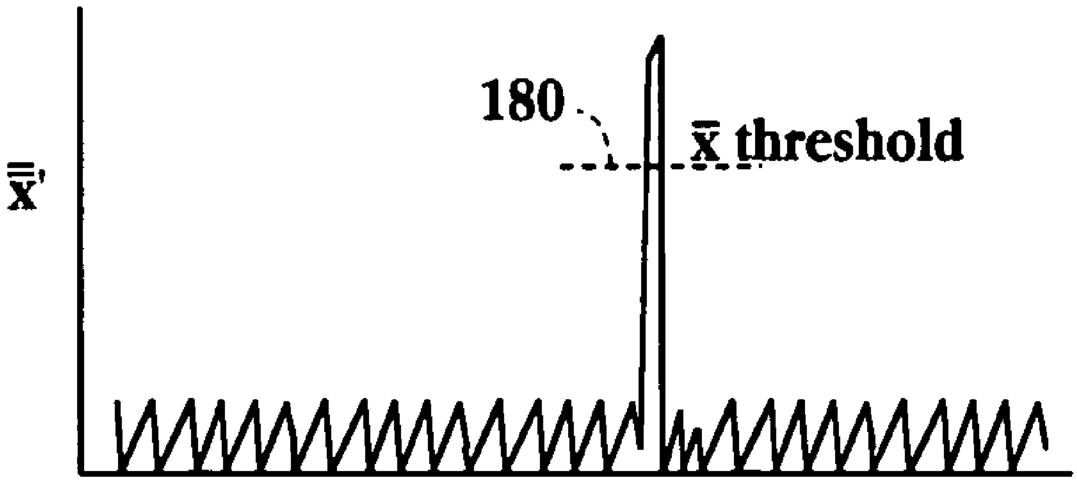
FIGS. 10A and 10B illustrate added robustness provided when the functionality described herein is applied to multiple microphones, e.g., a microphone array which is affixed to an input device, in accordance with one embodiment of the invention.
Figure 10B:
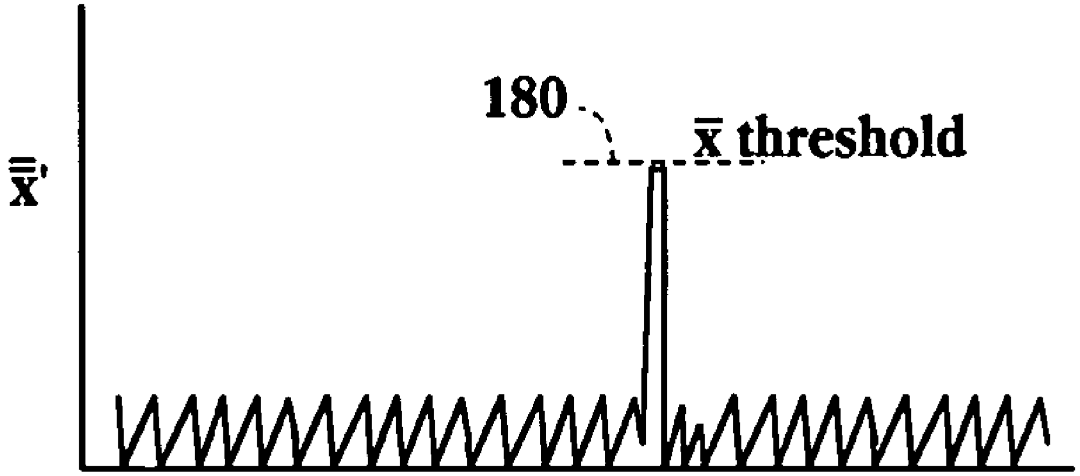

FIGS. 10A and 10B illustrate the added robustness provided when the functionality described herein is applied to multiple microphones, e.g., a microphone array which is affixed to an input device, in accordance with one embodiment of the invention. Due to the placement of the microphones at various locations, it should be appreciated that the signal detected by the various locations will have different amplitudes. Thus, in FIG. 10A a microphone located in one position will generate a signal which has a certain amplitude, while in FIG. 10B a microphone located in a different position generates a signal with a lower amplitude for the same audio signal. As the amplitude must cross a threshold value in order to be considered a noise disturbance, the signal generated in FIG. 10B does not cross that threshold. However, the signal generated in FIG. 10A does cross the threshold, as illustrated by line 180. In this embodiment, a decision on whether a current audio's disturbance may be made if any one of the channels appears as a positive detection, thereby enhancing the robustness.

Figure 11:
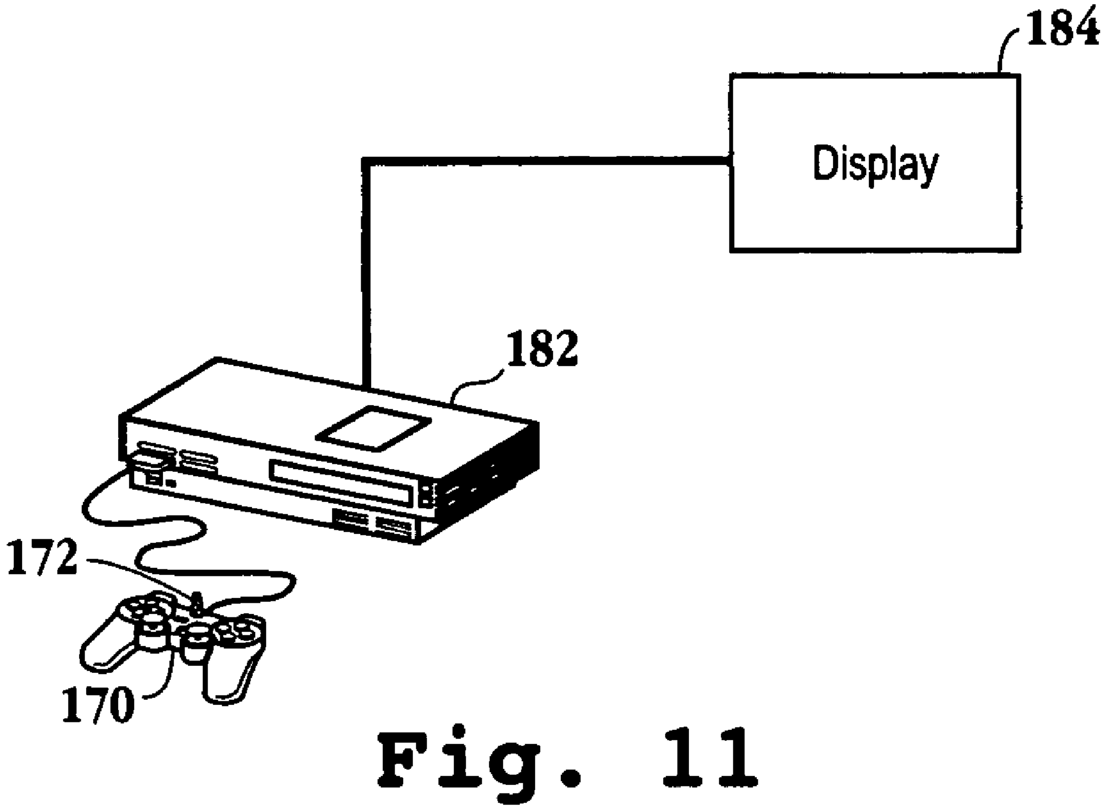
FIG. 11 is a simplified schematic diagram illustrating a system capable of canceling disturbances associated with an audio signal in accordance with one embodiment of the invention.

FIG. 11 is a simplified schematic diagram illustrating a system capable of canceling disturbances associated with an audio signal in accordance with one embodiment of the invention. Here, game controller 170, which includes microphone 172, is operatively connected to console 182. Console 182 in turn is in communication with display 184. Through the embodiments described herein, logic located within either video game controller 170 or console 182 may be used to detect and cancel mechanical disturbances caused by a user operating video game controller 170. Thus, voice recognition and other applications requiring the recording of a target audio signal, which may be interfered with by mechanical disturbances, will operate in a more efficient manner as a result of the elimination of the noise disturbances.

Figure 12:
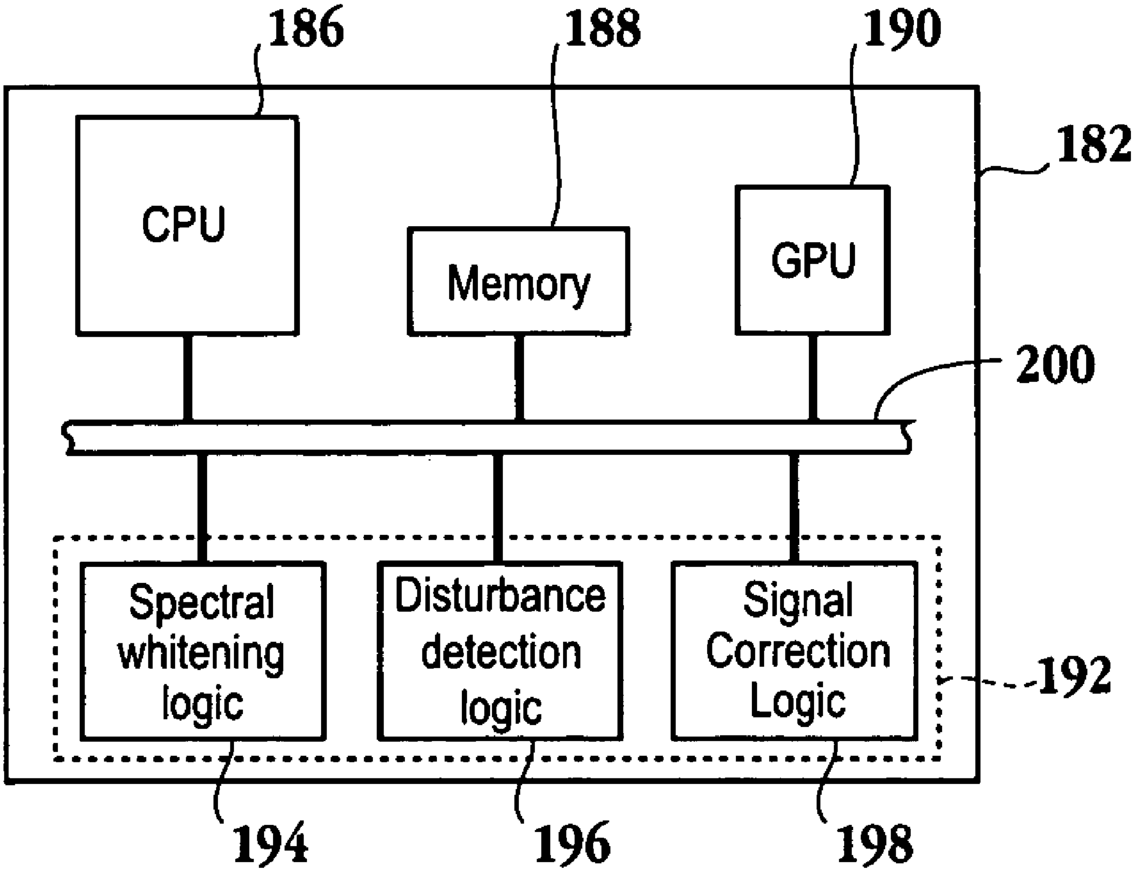
FIG. 12 is a simplified schematic diagram of the components of a computing device having noise disturbance cancellation functionality in accordance with one embodiment of the invention.

FIG. 12 is a simplified schematic diagram of the components of a computing device having noise disturbance cancellation functionality in accordance with one embodiment of the invention. Here, computing device 182 includes central processing unit (CPU) 186 and memory 188. Additionally, graphics processing unit (GPU) 190 may be included in computing device 182. Of course, the graphics processing functionality may be incorporated into CPU 186. Noise cancellation module 192 includes logic configured to execute the embodiments described herein. Logic module 192 includes spectral whitening logic 194, disturbance detection logic 196, and signal correction logic 192. Spectral whitening logic 194 includes logic configured to execute the functionality described with reference to FIGS. 3A and 3B, i.e., logic for magnifying a difference between a value associated with the target signal and a value associated with the noise disturbance. Disturbance detection logic 196 includes logic configured to execute the functionality associated with downsampling the output of spectral whitening logic 194. Additionally, disturbance detection logic 196 includes logic for generating a detection signal from the downsampled signal as described with reference to FIG. 4. Signal correction logic 198 includes the logic for executing the functionality described above with reference to FIGS. 5 through 8. CPU 186 memory 188, GPU 190 and noise cancellation logic modules 194, 196 and 198 are interconnected through bus 200.

In summary, the above described invention describes a method and a system for providing audio input in a high noise environment. The audio input system includes a microphone or microphone array that may be affixed to an input device, such as a video game controller, e.g., a SONY PLAYSTATION 2® video game controller, a PLAYSTATION PORTABLE (PSP) unit, or any other suitable video game controller. The microphone may be configured so as to not place any constraints on the movement of the video game controller. The signals received by the microphone are assumed to include a target noise in a far field and a noise disturbance in a near field. The target noise, also referred to as a harmonic component, is any noise desired to be recorded, e.g., a user's voice, music, etc. The noise disturbance may include noise emanating from the near field, e.g., mechanical noise from the input device, percussive sounds, etc. The audio signal is processed through a spectral whitening scheme that reduces the amplitude associated with the target sound while preserving the characteristics of the noise signal, thereby amplifying the magnitude between the target and noise components in order to assist in the disturbance detection phase. The output of the spectral whitening scheme is processed through an IIR filter, downsampled and then a derivative function is applied to the signal in the disturbance detection scheme. Here, a signal sequence of the signal is further "whitened" and then decorrelated in order to identify a signal sequence type. Once the signal sequence is identified, the signal is adjusted according to the type of signal sequence as discussed above. The downsampling scheme not only reduces the amount of data to be sampled, but also enables the use of a lower order derivative, which is more stable relative to application of a higher order derivative.

It should be appreciated that the embodiments described herein may also apply to on-line gaming applications. That is, the embodiments described above may occur at a server that sends a video signal to multiple users over a distributed network, such as the Internet, to enable players at remote noisy locations to communicate with each other. It should be further appreciated that the embodiments described herein may be implemented through either a hardware or a software implementation. That is, the functional descriptions discussed above may be synthesized to define a microchip having logic configured to perform the functional tasks for each of the modules associated with the noise cancellation scheme.

With the above embodiments in mind, it should be understood that the invention may employ various computer-implemented operations involving data stored in computer systems. These operations include operations requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

The above described invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a communications network.

The invention can also be embodied as computer readable code on a computer readable medium. The computer readable medium is any data storage device that can store data which can be thereafter read by a computer system, including an electromagnetic wave carrier. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A video game controller in communication with a computing device, comprising:

a microphone affixed to the video game controller, the microphone configured to detect an audio signal that includes a target audio signal in a far field relative to the microphone and disturbance noise in a near field relative to the microphone;

logic to process the audio signal, the logic including, logic for executing signal decorrelation on the audio signal, the signal decorrelation acting to reduce an amplitude of the target audio signal while magnifying the disturbance noise;

logic for down sampling the decorrelated audio signal;

detection signal logic to generate a detection signal through an even ordered derivative that is less than or equal to a tenth derivative that is applied to the decorrelated and down sampled audio signal; and disturbance cancellation logic for removing disturbance noise from the audio signal through analysis of the detection signal.

2. The video game controller of claim 1, wherein the disturbance cancellation logic includes, logic for identifying if a signal sequence of the disturbance noise is associated with the target audio signal.

3. The video game controller of claim 2, further comprising multiple microphones, wherein each of the multiple microphones is defined to independently identify whether the disturbance noise is above a threshold level.

4. The video game controller of claim 1, wherein the down sampling reduces an amount of data associated with the detection signal, as compared to the audio signal, by a factor of ten.

5. Non-transitory computer readable media having program instructions for processing an audio signal obtained from a video game controller having a microphone affixed thereto, the microphone configured to detect an audio signal that includes a target audio signal in a far field relative to the microphone and disturbance noise in a near field relative to the microphone, the computer readable media further having, program instructions to process the audio signal, the program instructions including, instructions for executing signal decorrelation on the audio signal, the signal decorrelation acting to reduce an amplitude of the target audio signal while magnifying the disturbance noise;

instructions for down sampling the decorrelated audio signal;

detection signal instructions to generate a detection signal through an even ordered derivative that is less than or equal to a tenth derivative that is applied to the decorrelated and down sampled audio signal; and disturbance cancellation instructions for removing disturbance noise from the audio signal through analysis of the detection signal.

6. The non-transitory computer readable media of claim 5, wherein the disturbance cancellation instructions include, program instructions for identifying if a signal sequence of the disturbance noise is associated with the target audio signal.

7. The non-transitory computer readable media of claim 5, wherein the down program instructions for down sampling reduces an amount of data associated with the detection signal, as compared to the audio signal, by a factor of ten.

* * * * *